United States Patent
Zhan et al.

(10) Patent No.: US 12,433,042 B2
(45) Date of Patent: Sep. 30, 2025

(54) IMAGE SENSOR STRUCTURE AND MANUFACTURING METHOD THEREOF

(71) Applicant: UNITED MICROELECTRONICS CORPORATION, Hsinchu (TW)

(72) Inventors: Zhaoyao Zhan, Singapore (SG); Jing Feng, Singapore (SG); Xiaohong Jiang, Singapore (SG); Ching Hwa Tey, Singapore (SG)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 662 days.

(21) Appl. No.: 17/861,276

(22) Filed: Jul. 11, 2022

(65) Prior Publication Data
US 2023/0387174 A1    Nov. 30, 2023

(30) Foreign Application Priority Data
May 31, 2022   (TW) .................... 111120323

(51) Int. Cl.
*H10F 39/18*    (2025.01)
*H10F 39/00*    (2025.01)

(52) U.S. Cl.
CPC ......... *H10F 39/182* (2025.01); *H10F 39/011* (2025.01); *H10F 39/8033* (2025.01); *H10F 39/811* (2025.01)

(58) Field of Classification Search
CPC combination set(s) only.
See application file for complete search history.

(56) References Cited

U.S. PATENT DOCUMENTS

| | | | |
|---|---|---|---|
| 7,675,101 B2 * | 3/2010 | Hwang | H10F 39/807 257/292 |
| 8,765,333 B2 | 7/2014 | Yu | |
| 8,779,484 B2 | 7/2014 | Shen et al. | |
| 9,129,876 B2 | 9/2015 | Peng | |
| 9,279,923 B2 | 3/2016 | Yu | |
| 12,176,375 B2 | 12/2024 | Zhan et al. | |
| 2008/0067621 A1 * | 3/2008 | Chang | H10F 39/016 438/96 |
| 2019/0073943 A1 * | 3/2019 | Zhou | H10H 20/857 |
| 2022/0165895 A1 * | 5/2022 | Zhan | H10F 77/122 |

(Continued)

*Primary Examiner* — Mark W Tornow
*Assistant Examiner* — Priya M Rampersaud

(57) ABSTRACT

An image sensor structure includes a semiconductor substrate; an interconnection layer on the semiconductor substrate; nano-pillar structures, each including a first doped layer, a second doped layer and a third doped layer stacked in sequence; conductive structures, respectively electrically connected to the first doped layer and the interconnection layer, the second doped layer and the interconnection layer, and the third doped layer and the interconnection layer; a first insulating layer on the interconnection layer and wrapping the nano-pillar structures and the conductive structures, wherein the first doping layer is exposed on the first insulating layer; a transparent barrier layer on the first insulating layer; and a photoelectric thin film structure on the first insulating layer and electrically connected to the interconnection layer. The photoelectric thin film structure includes photoconductive film portions. The image sensor structure has a good isolation effect between adjacent pixels and effectively avoids optical crosstalk.

28 Claims, 14 Drawing Sheets

(56) References Cited

U.S. PATENT DOCUMENTS

2022/0336519 A1\* 10/2022 Zhan .................. H10F 39/811
2023/0225139 A1\* 7/2023 Zhan .................. H10K 85/50
257/40

\* cited by examiner

IMAGE SENSOR STRUCTURE AND MANUFACTURING METHOD THEREOF

FIELD OF THE INVENTION

The present invention relates to a semiconductor technology, and more particularly to an image sensor structure and a manufacturing method thereof.

BACKGROUND OF THE INVENTION

Image sensors have been widely used in digital still cameras, cellular phones, security cameras, as well as medical, automotive and other applications. The image sensor includes a plurality of light sensors (such as photodiodes) for receiving incident image light from an external scene. Each light sensor absorbs a part of the incident image light and generates image charges after absorbing the image light. Because the amount of image charges is proportional to the intensity of the image light, the generated image charges can be used to generate images representing external scenes.

With the continuous development of the technology used to manufacture image sensors (such as CIS), the image sensors are further integrated towards high resolution and miniaturization. Thus, how to avoid the increased possibility of optical crosstalk between the light sensors and at the same time have high-resolution images is what the industry is striving for.

SUMMARY OF THE INVENTION

The present invention provides an image sensor structure and a manufacturing method thereof. In the image sensor structure, the red (R)/green (G)/blue (B) photosensitive regions are balanced, the adjacent pixels have improved isolation effect, and the problem of optical crosstalk is effectively avoided.

The image sensor structure provided by the present invention includes a semiconductor substrate, an interconnection layer, a nano-pillar structure, a first conductive structure, a second conductive structure, a third conductive structure, a first insulating layer, a transparent barrier layer, and an optoelectronic thin film structure. The interconnection layer is disposed on the semiconductor substrate. The nano-pillar structure includes a first doped layer, a second doped layer and a third doped layer stacked in sequence. The third doped layer is adjacent to the interconnection layer, and the first doped layer is away from the interconnection layer. The first conductive structure is electrically connected to the first doped layer and the interconnection layer. The second conductive structure is electrically connected to the second doped layer and the interconnection layer. The third conductive structure is electrically connected to the third doped layer and the interconnection layer. The first insulating layer is formed on the interconnection layer to wrap the nano-pillar structure, the first conductive structure, the second conductive structure and the third conductive structure. The first doped layer of the nano-pillar structure is exposed on the first insulating layer. The transparent barrier layer is formed on the first insulating layer to cover the exposed first doped layer. The optoelectronic thin film structure is disposed on the transparent barrier layer and electrically connected to the interconnection layer. The optoelectronic thin film structure includes a photoconductive film portion corresponding to the nano-pillar structure.

In an embodiment of the present invention, the first conductive structure includes a first doped layer electrode and a first conductive plug. The first doped layer electrode surrounds and is connected to a sidewall of the first doped layer. The first conductive plug penetrates through the first insulating layer and is electrically connected to the first doped layer electrode and the interconnection layer.

In an embodiment of the present invention, the second conductive structure includes a second doped layer electrode and a second conductive plug. The second doped layer electrode surrounds and is connected to a sidewall of the second doped layer. The second conductive plug penetrates through the first insulating layer and is electrically connected to the second doped layer electrode and the interconnection layer.

In an embodiment of the present invention, the third conductive structure includes a third conductive plug penetrating through the first insulating layer and electrically connected to the third doped layer and the interconnection layer.

In an embodiment of the present invention, the first doped layer and the second doped layer form a blue light image sensor. The second doped layer and the third doped layer form a red light image sensor. The photoelectric thin film structure is a green light image sensor.

In an embodiment of the present invention, the first doped layer and the third doped layer have a same first doping type, the second doped layer has a second doping type, and the second doping type is different from the first doping type.

In an embodiment of the present invention, the photoconductive film portion includes a conductive pillar and a first transparent electrode, a hole transport portion, an absorbing material portion, an electron transfer portion, and a second transparent electrode stacked in sequence. The conductive pillar penetrates through the transparent barrier layer and the first insulating layer. One end of the conductive pillar is electrically connected to the interconnection layer, and the other end of the conductive pillar is electrically connected to the first transparent electrode.

In an embodiment of the present invention, the photoelectric thin film structure is a green light image sensor. The absorbing material portion includes perovskite or organic photoelectric material.

In an embodiment of the present invention, the photoelectric thin film structure further includes a second insulating layer and a transparent package. The second insulating layer is disposed on the transparent barrier layer and filled between the photoconductive film portions. The transparent package wraps the second insulating layer and the photoconductive film portion.

In an embodiment of the present invention, the transparent barrier layer is an oxide layer.

The manufacturing method of the image sensor structure provided by the present invention includes: forming a semiconductor stack structure, wherein the semiconductor stack structure includes a first doped material layer, a second doped material layer and a third doped material layer stacked in sequence, the first doped material layer includes a first portion and a second portion, the second portion is located on the first portion and is between the second doped material layer and the first portion; forming a mask layer on the semiconductor stack structure, patterning the mask layer and the semiconductor stack structure, forming a plurality of first trenches penetrating through the mask layer, the third doped material layer, the second doped material layer and the second portion, so as to form a plurality of nano-pillar structures and a plurality of mask portions on the first portion, and exposing the first portion through the first trenches, wherein each of the nano-pillar structures includes a first doped layer, a second doped layer and a third doped layer stacked on the first portion in sequence, and each of the mask portions is located on the third doped layer; forming a first doped layer electrode and a second doped layer electrode in the first trenches, wherein the first doped layer electrode is connected to a sidewall of the first doped layer, and the second doped layer electrodes is connected to a sidewall of the second doped layer; forming a first insulating layer to cover the nano-pillar structures and the first trenches; forming a plurality of conductive plugs to penetrate the first insulating layer, wherein first ends of the conductive plugs are respectively electrically connected to the first doped layer electrode, the second doped layer electrode and the third doped layer of the nano-pillar structure, and second ends of the conductive plugs are exposed on the first insulating layer; forming an interconnection layer on the first insulating layer, wherein the conductive plug is electrically connected to the interconnection layer; bonding a semiconductor substrate on the interconnection layer; removing the first portion to expose the first doped layer of the nano-pillar structure; forming a transparent barrier layer to cover the exposed first doped layer; and forming an optoelectronic thin film structure on the transparent barrier layer, wherein the optoelectronic thin film structure is electrically connected to the interconnection layer, and the optoelectronic thin film structure includes a plurality of photoconductive film portions corresponding to the nano-pillar structures respectively.

In an embodiment of the present invention, a method for forming the semiconductor stack structure is selected from one of an epitaxial growth process and an ion implantation process or a combination thereof.

In an embodiment of the present invention, a method for forming the first doped layer electrode and the second doped layer electrode includes: forming a first dielectric layer on the first portion exposed through the first trenches; forming the first doped layer electrode on the first dielectric layer, wherein the first doped layer electrode surrounds and is connected to the sidewall of the first doped layer; forming a second dielectric layer on the first dielectric layer to cover the first doped layer electrode; and forming the second doped layer electrode on the second dielectric layer, wherein the second doped layer electrode surrounds and is connected to the sidewall of the second doped layer, and the first dielectric layer and the second dielectric layer are used as a part of the first insulating layer.

In an embodiment of the present invention, a method for forming the first insulating layer includes: forming a third dielectric layer on the second dielectric layer to cover the second doped layer electrode, the nano-pillar structure and the mask portion; removing a part of the third dielectric layer and the mask portion to expose the third doped layer; and forming a fourth dielectric layer on the third dielectric layer to cover the third doped layer.

In an embodiment of the present invention, the photoconductive film portion includes a conductive pillar and a first transparent electrode, a hole transport portion, an absorbing material portion, an electron transfer portion, and a second transparent electrode stacked in sequence. The conductive pillar penetrates through the transparent barrier layer and the first insulating layer. One end of the conductive pillar is electrically connected to the interconnection layer, and the other end of the conductive pillar is electrically connected to the first transparent electrode.

In an embodiment of the present invention, a method for forming the photoelectric thin film structure includes: forming a plurality of conductive pillars and a plurality of first transparent electrodes, wherein the conductive pillars penetrate through the transparent barrier layer and the first insulating layer, one end of the conductive pillar is electrically connected to the interconnection layer, the other end of the conductive pillar is electrically connected to the first transparent electrode, the first transparent electrodes are distributed and exposed on the transparent barrier layer, and a distribution of the first transparent electrodes corresponds to the nano-pillar structures; forming a hole transport layer on the transparent barrier layer and patterning the hole transport layer, wherein the patterned hole transport layer includes hole transport portions respectively disposed on the first transparent electrodes; forming a second insulating layer on the transparent barrier layer to cover the hole transport portions; patterning the second insulating layer to form second trenches in the second insulating layer, wherein the hole transport portions are exposed through the second trenches respectively; forming absorbing material portions, wherein the absorbing material portions are formed in the second trenches and disposed on the hole transport portions respectively; forming electron transport portions, wherein the electron transport portions are formed in the second trenches and disposed on the absorbing material portions respectively; forming second transparent electrodes, wherein the second transparent electrodes are formed in the second trenches and disposed on the electron transport portions respectively; and forming a transparent package to wrap the second insulating layer and the second transparent electrodes.

In an embodiment of the present invention, a method for forming the hole transport layer includes: depositing $WO_3$, $MoO_x$, $NiO_x$ or a combination thereof.

In an embodiment of the present invention, the absorbing material portion includes perovskite, and a material of the perovskite includes $MAPbBr_3$, $CsPbBr_3$, $FAPbBr_3$, $MASnBr_3$, or a combination thereof.

In an embodiment of the present invention, a method for forming the electron transport portion includes: depositing $TiO_2$, $ZnO$, $SnO_2$, $MoO_x$, or a combination thereof, and then forming an aluminum layer.

In an embodiment of the present invention, materials of the first transparent electrode and the second transparent electrode include AZO, indium-doped cadmium oxide, FTO (Fluorine-doped Tin Oxide) or IZO.

In an embodiment of the present invention, a method for forming the photoelectric thin film structure includes: forming a plurality of conductive pillars and a plurality of first transparent electrodes, wherein the conductive pillars penetrate through the transparent barrier layer and the first insulating layer, one of the conductive pillar is electrically connected to the interconnection layer, the other end of the conductive pillar is electrically connected to the first transparent electrode, the first transparent electrodes are distributed and exposed on the transparent barrier layer, and a distribution of the first transparent electrodes corresponds to the nano-pillar structures; forming a photoconductive film stack structure on the transparent barrier layer, a method for forming the photoconductive film stack structure includes sequentially forming a hole transport layer, an organic photoconductive film, an electron transport layer, a transparent electrode layer and a protective layer; patterning the photoconductive film stack structure and removing the protective layer to form sub-stack structures, wherein the sub-stack structures are respectively located on the first transparent electrodes, and the sub-stack structure includes a hole transport portion, an organic photoconductive film portion, an electron transport portion and a second transparent electrode in sequence; forming a second insulating layer on the transparent barrier layer and filling the second insulating layer between the sub-stack structures; and forming a transparent package to wrap the second insulating layer and the sub-stack structures.

In an embodiment of the present invention, a method for forming the hole transport layer includes: coating PEDOT: PSS, $NiO_x$, $MoO_x$, Spiro-MeOTAD, or a combination thereof.

In an embodiment of the present invention, the organic photoconductive film includes an electron donor and an electron acceptor. A material of the electron donor includes boron subphthalocyanine chloride or N,N'-dimethylquinacridone. A material of the electron acceptor includes pentafluorophenoxy substituted boron subphthalocyanine chloride or di-n-butyl substituted dicyanovinyltrithiophene.

In an embodiment of the present invention, a light absorption peak of the organic photoconductive film is between 500 nm and 600 nm.

In an embodiment of the present invention, a method for forming the electron transport portion includes: depositing $TiO_2$, ZnO, $SnO_2$, $MoO_x$, or a combination thereof, and then forming an aluminum layer.

In an embodiment of the present invention, materials of the first transparent electrodes and the second transparent electrodes include ITO, AZO, indium-doped cadmium oxide, FTO or IZO.

In the present invention, the first insulating layer wraps the nano-pillar structures. The nano-pillar structures include stacked red light image sensors and blue light image sensors. The photoelectric thin film structure is disposed at intervals on the first insulating layer. The photoelectric thin film structure includes a photoconductive film portion for sensing green light. Thus, through the design in which the photoconductive film portion for sensing green light and the blue/red light image sensors stacked in the nano-pillar structure 22 are separated, the spectral characteristics of the image sensor structure are improved, the red (R)/green (G)/blue (B) photosensitive regions are balanced, the adjacent pixels (i.e., the adjacent nano-pillar structures 22) have improved isolation effect, and the problem of optical crosstalk is also effectively avoided. In addition, the image sensor structure of the embodiment of the present invention is a backside illumination (BSI) structure. Thus, the incident light is not affected by the conductive pillars or the conductive wires of the interconnection layer and therefore is not deflected, thereby effectively improving the filling factor and quantum efficiency.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
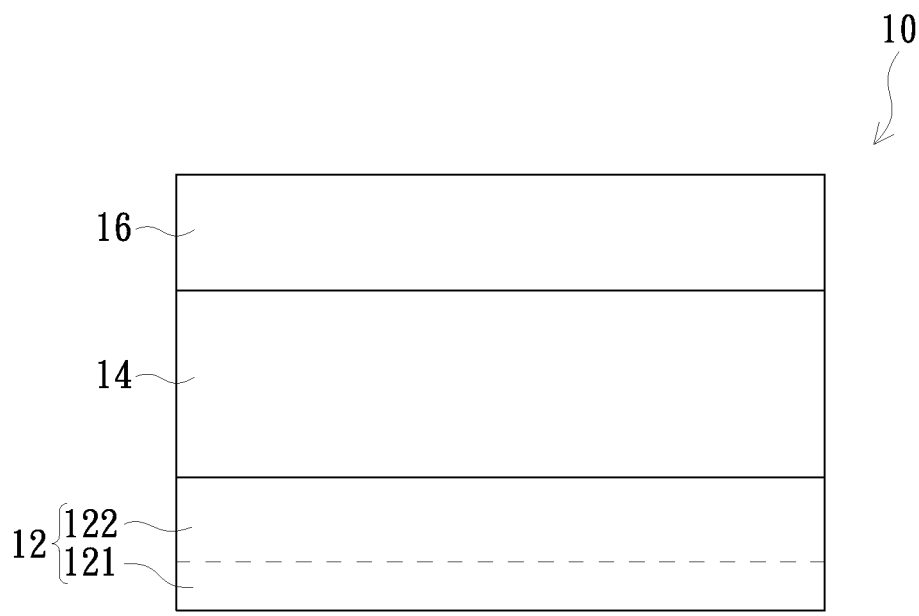
FIGS. 1A to 1N are schematic cross-sectional views illustrating a manufacturing method of an image sensor structure according to an embodiment of the present invention.
Figure 1B:
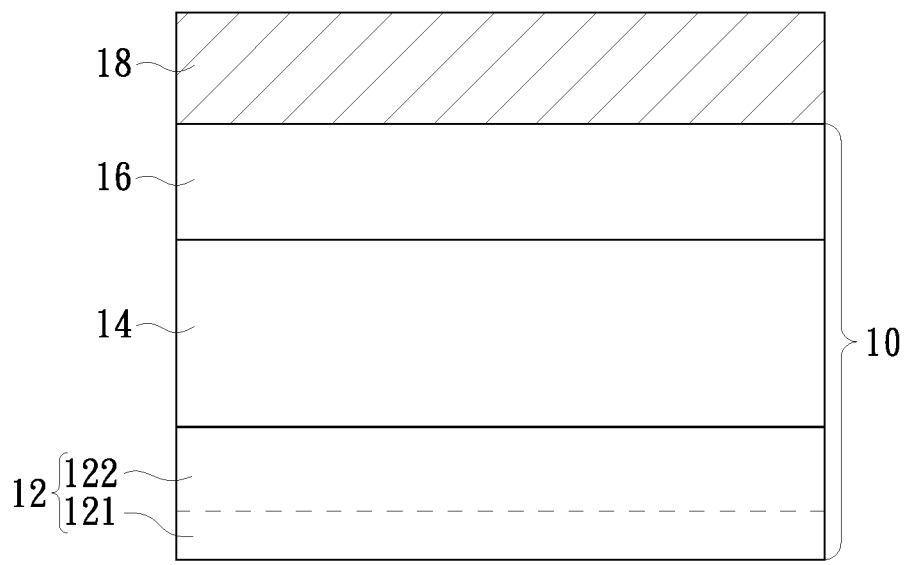
Figure 1C:
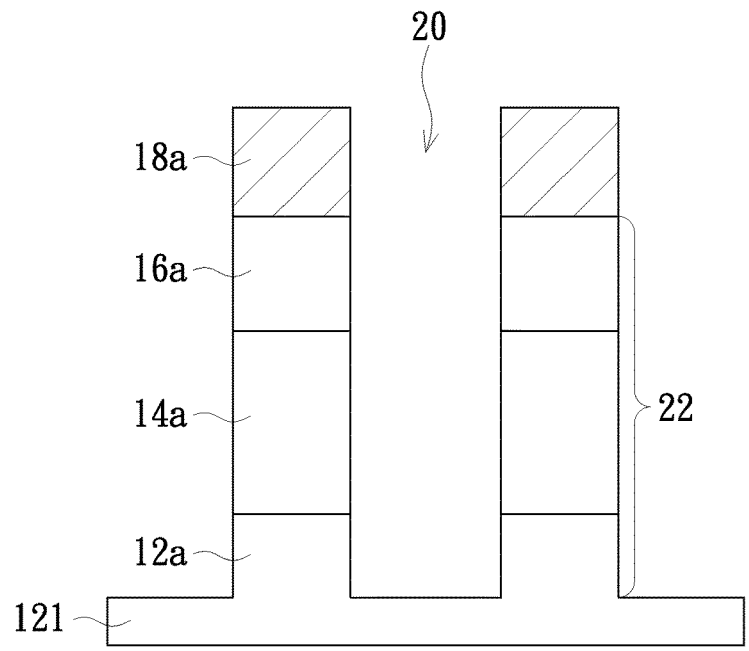
Figure 1D:
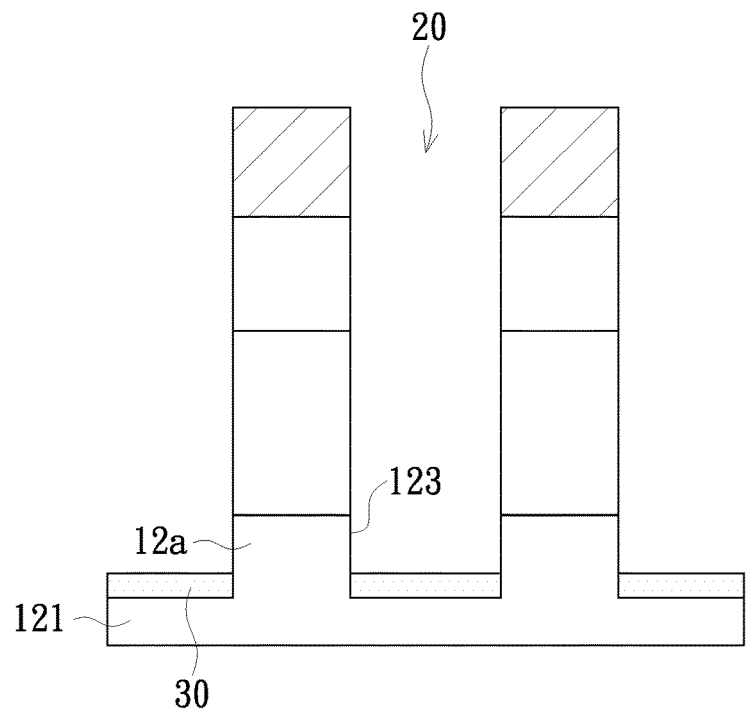
Figure 1E:
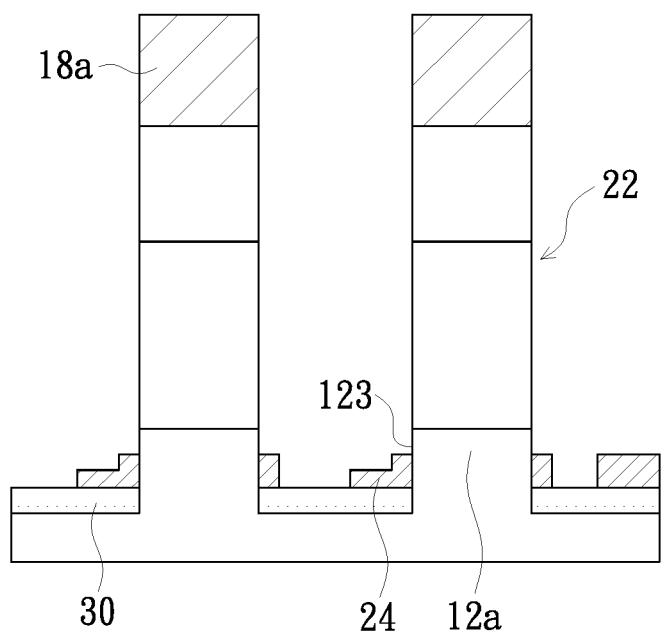
Figure 1F:
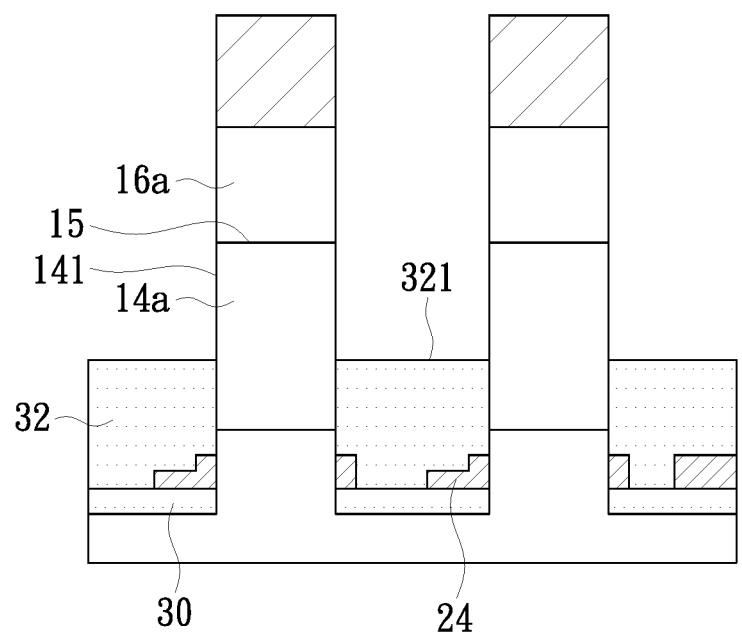
Figure 1G:
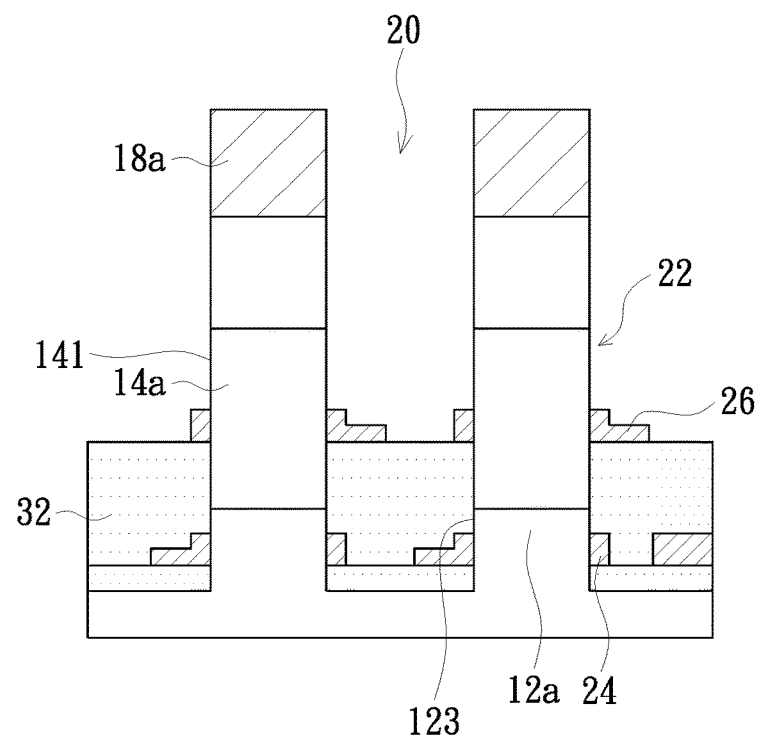
Figure 1H:
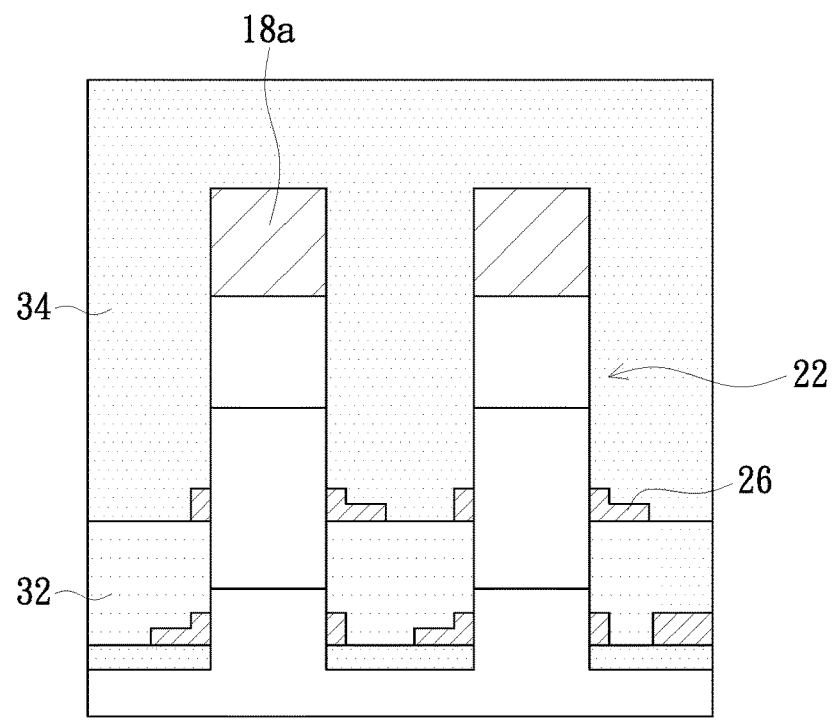
Figure 1I:
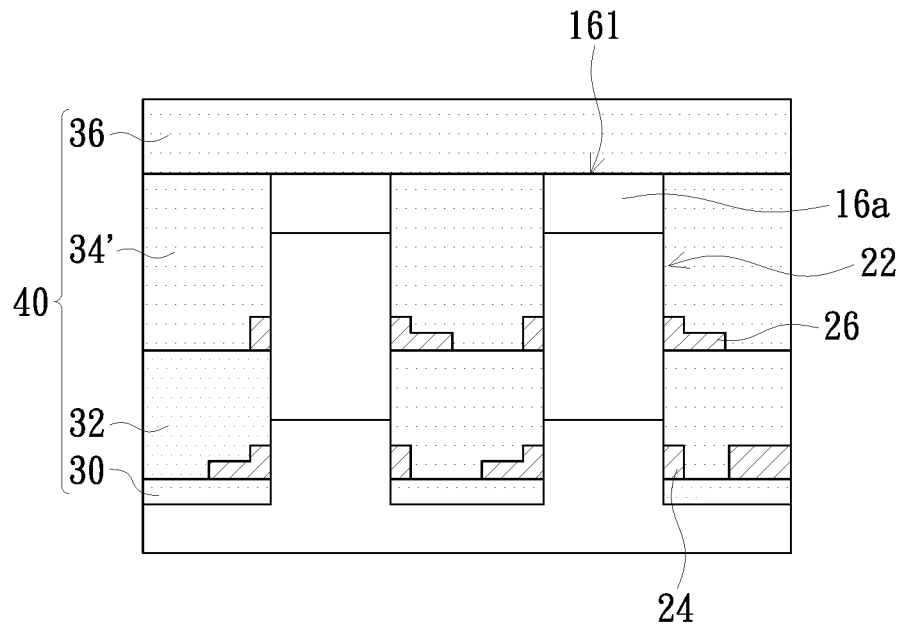
Figure 1J:
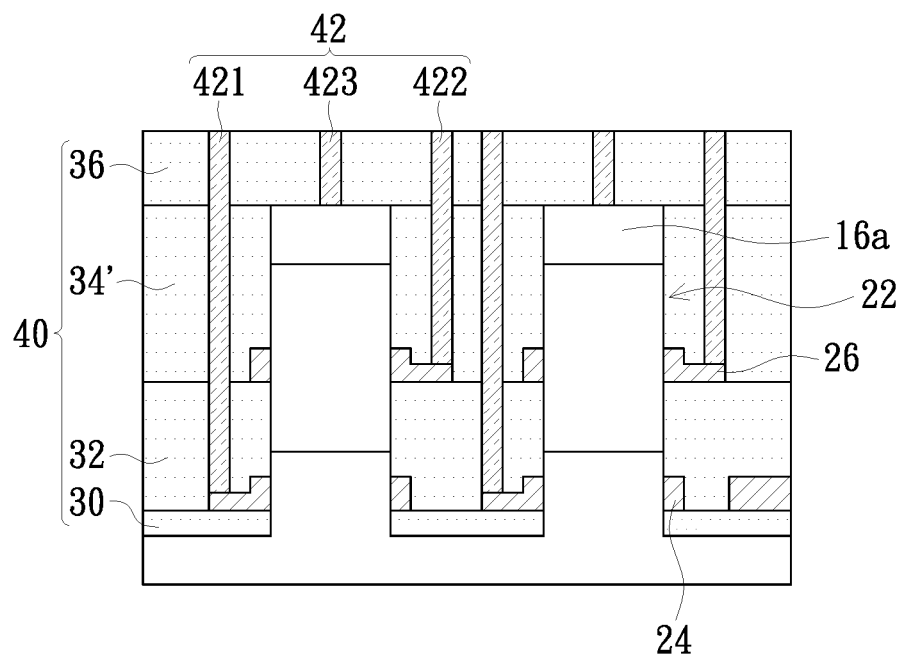
Figure 1K:
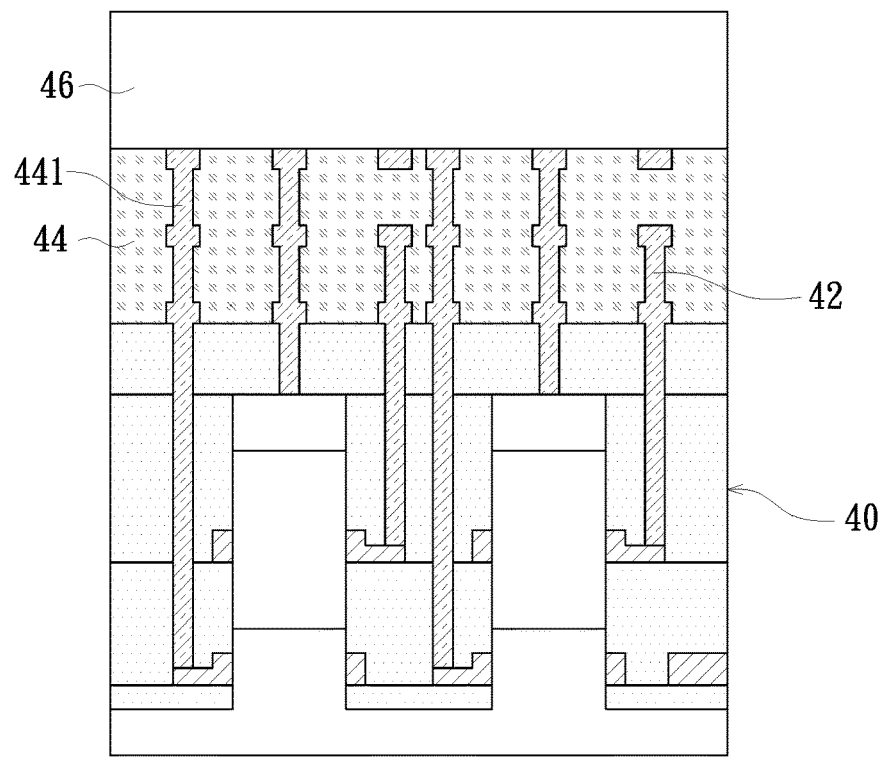
Figure 1L:
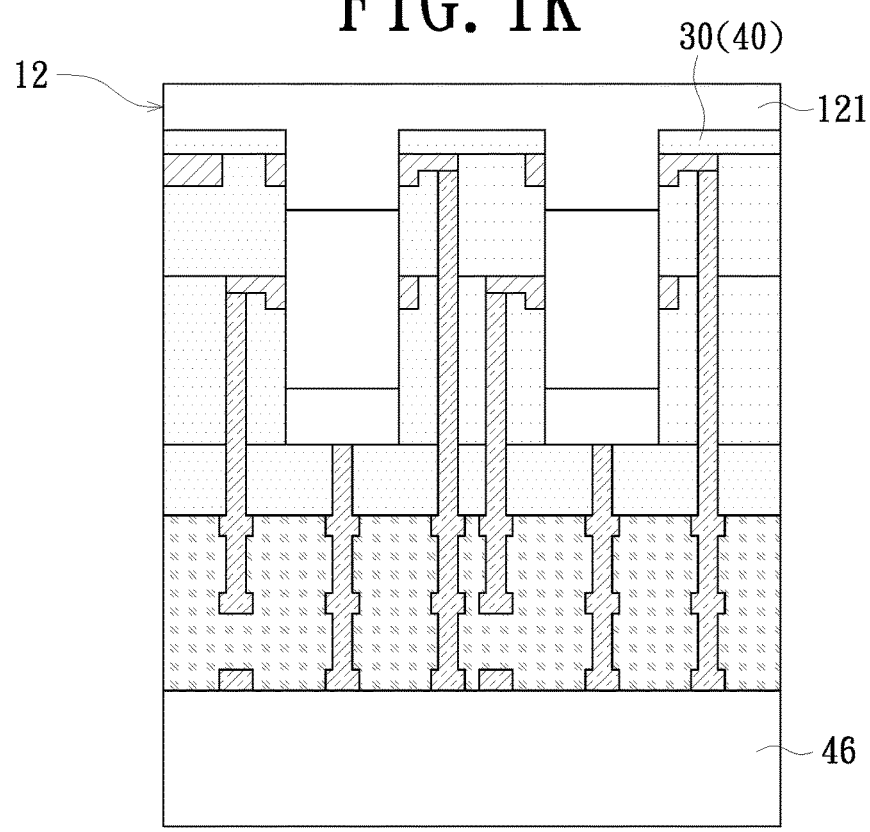
Figure 1M:
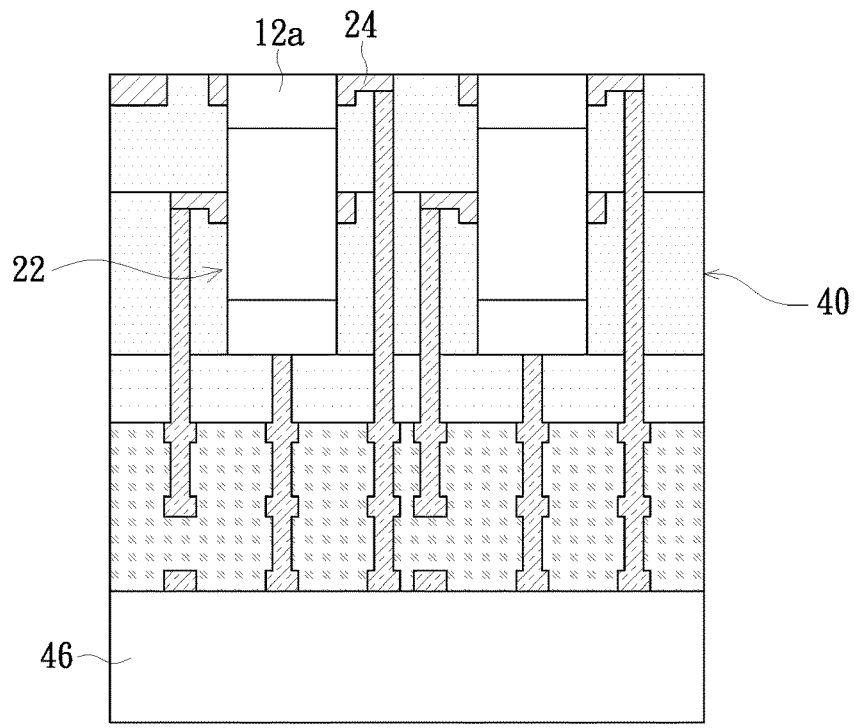
Figure 1N:
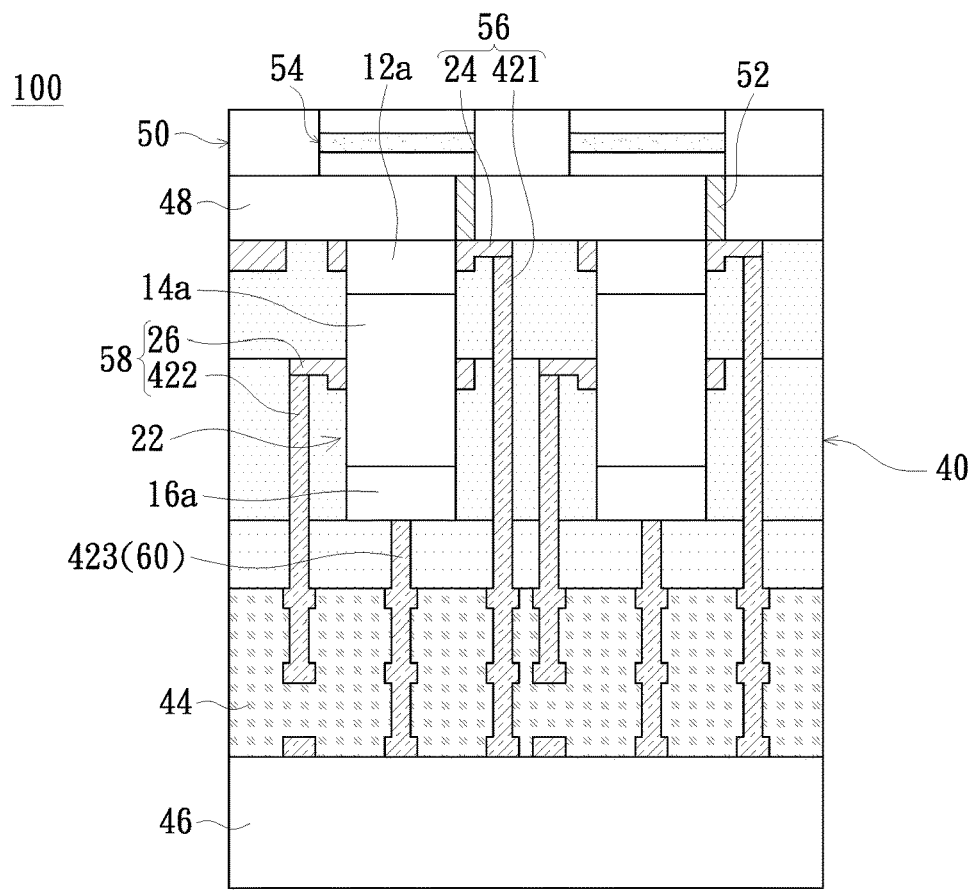

FIGS. 1A to 1N are schematic cross-sectional views illustrating a manufacturing method of an image sensor structure according to an embodiment of the present invention. As shown in FIG. 1A, a semiconductor stack structure 10 is formed. The semiconductor stack structure 10 includes a first doped material layer 12, a second doped material layer 14 and a third doped material layer 16 stacked in sequence. The first doped material layer 12 includes a first portion 121 and a second portion 122. In one embodiment, the first portion 121 is defined as the lower portion of the first doped material layer 12, and the second portion 122 is defined as the upper portion of the first doped material layer 12. The second portion 122 is located on the first portion 121 and between the second doped material layer 14 and the first portion 121. In one embodiment, the method for forming the semiconductor stack structure 10 is selected from one of an epitaxial growth process and an ion implantation process or a combination thereof. That is, the first doped material layer 12, the second doped material layer 14 and the third doped material layer 16 can be formed by an epitaxial growth process, or by multi-stage ion implantation with high temperature process.

The first doped material layer 12 and the third doped material layer 16 may have the same first doping type, the second doped material layer 14 may have a second doping type, and the second doping type is different from the first doping type. Specifically, in one embodiment, the first doped material layer 12 is, for example, a p-type substrate, and its doping concentration is, for example, about $10^{15}$ (ions/$cm^3$) level; the second doped material layer 14 is, for example, n-type doped, and its doping concentration is about $10^{16}$ (ions/$cm^3$) level; and the third doped material layer 16 is, for example, p-type doping, and its doping concentration is about $10^{17}$ (ions/$cm^3$) level.

As shown in FIG. 1B, a mask layer 18 is formed on the semiconductor stack structure 10. The material of the mask layer 18 is, for example, silicon oxide, silicon nitride, or a combination thereof. The mask layer 18 is formed by, for example, chemical vapor deposition (CVD) process. Then, as shown in FIG. 1C, the mask layer 18 and the semiconductor stack structure 10 are performed by a patterning process to form a plurality of first trenches 20. The first trenches 20 penetrate through the mask layer 18 (labeled in FIG. 1B), the third doped material layer 16 (labeled in FIG. 1B), the second doped material layer 14 (labeled in FIG. 1B), and the second portion 122 (labeled in FIG. 1B) of the first doped material layer 12 (labeled in FIG. 1B), so as to form a plurality of nano-pillar structures 22 on the first portion 121 and a plurality of mask portions 18a. The nano-pillar structure 22 includes a first doped layer 12a, a second doped layer 14a and a third doped layer 16a sequentially stacked on the first portion 121 from bottom to top. Each mask portion 18a is located on the respective third impurity layer 16a. Part of the first portion 121 between the nano-pillar structures 22 is exposed by the first trench 20. In one embodiment, the aforementioned patterning process includes, for example, a lithography process and an etching process.

Then, a plurality of first doped layer electrodes 24 (shown in FIG. 1G) and a plurality of second doped layer electrodes 26 (shown in FIG. 1G) are formed in the first trenches 20. Each first doped layer electrode 24 is connected to a sidewall 123 of the first doped layer 12a, and each second doped layer electrode 26 is connected to a sidewall 141 of the second doped layer 14a. FIGS. 1D to 1G are schematic views illustrating the method for forming the first doped layer electrode 24 and the second doped layer electrode 26. As shown in FIG. 1D, a first dielectric layer 30 is formed on the part of the first portion 121 exposed by the first trench 20. The thickness of the first dielectric layer 30 is less than that of the first doped layer 12a, so that part of the sidewall 123 of the first doped layer 12a can be exposed. Then, as shown in FIG. 1E, the first doped layer electrode 24 is formed on the first dielectric layer 30. The first doped layer electrode 24 surrounds and is connected to the sidewall 123 of the first doped layer 12a. In one embodiment not shown, the first doped layer electrode 24 can be manufactured by, for example, firstly conformally forming a conductive layer on the first dielectric layer 30, the nano-pillar structure 22 and the mask portion 18a, forming a patterned photoresist layer on part of the conductive layer, using the patterned photoresist layer as a mask to remove part of the conductive layer, removing the patterned photoresist layer, and using the unremoved conductive layer as the first doped layer electrode 24.

Then, as shown in FIG. IF, a second dielectric layer 32 is formed on the first dielectric layer 30 to cover the first doped layer electrode 24. In one embodiment, a top surface 321 of the second dielectric layer 32 is lower than a p-n junction 15 between the second doped layer 14a and the third doped layer 16a, that is, part of the sidewall 141 of the second doped layer 14a is not covered by the second dielectric layer 32. Then, as shown in FIG. 1G, the second doped layer electrode 26 is formed on the second dielectric layer 32, and the second doped layer electrode 26 surrounds and is connected to the sidewalls 141 of the second doped layer 14a. In one embodiment not shown, the second doped layer electrode 26 can be manufactured by, for example, firstly conformally forming a conductive layer on the second dielectric layer 32, the nano-pillar structure 22 and the mask portion 18a, forming a patterned photoresist layer on part of the conductive layer, using the patterned photoresist layer as a mask to remove part of the conductive layer, removing the patterned photoresist layer, and using the unremoved conductive layer as the second doped layer electrode 26.

The materials of the first doped layer electrode 24 and the second doped layer electrode 26 are, for example, tungsten (W), aluminum (Al), titanium nitride (TiN), tantalum nitride (TaN), titanium carbide (TiC), titanium aluminum (TiAl), titanium aluminum Nitride (TiAlN), titanium carbon nitride (TiCN) or doped polysilicon.

Then, as shown in FIG. 1H, a third dielectric layer 34 is formed on the second dielectric layer 32 to cover the second doped layer electrode 26, the nano-pillar structure 22 and the mask portion 18a. Then, as shown in FIG. 1I, part of the third dielectric layer 34 and the mask portion 18a are removed to expose an upper surface 161 of the third doped layer 16a. In one embodiment, the unremoved third dielectric layer 34' and the upper surface 161 of the third doped layer 16a are coplanar. Then, a fourth dielectric layer 36 is formed on the third dielectric layer 34' to cover the third doped layer 16a.

The materials of the first dielectric layer 30, the second dielectric layer 32, the third dielectric layer 34 and the fourth dielectric layer 36 are, for example, silicon nitride (SiN), silicon carbon nitride (SiCN), silicon oxynitride (SiON), or a combination thereof. The method for forming the first dielectric layer 30/the second dielectric layer 32/the third dielectric layer 34/the fourth dielectric layer 36 is, for example, a chemical vapor deposition (CVD) process, a physical vapor deposition (PVD) process or an atomic layer deposition (ALD) process. In the following description, the first dielectric layer 30, the second dielectric layer 32, the third dielectric layer 34' and the fourth dielectric layer 36 stacked in sequence are referred to as a first insulating layer 40. That is, the first insulating layer 40 covers the nano-pillar structure 22, the first trench 20 (labeled in FIG. 1G), the first doped layer electrode 24 and the second doped layer electrode 26.

Then, as shown in FIG. 1J, a plurality of conductive plugs 42 are formed, wherein the conductive plugs 42 penetrate part of the first insulating layer 40 (e.g., penetrate the fourth dielectric layer 36, the third dielectric layer 34' and the second dielectric layer 32). First ends of the conductive plugs 42 are respectively electrically connected to the first doped layer electrode 24, the second doped layer electrode 26 and the third doped layer 16a, and second ends of the conductive plugs 42 are exposed on the first insulating layer 40. For the convenience of description, the conductive plugs 42 include a first conductive plug 421, a second conductive plug 422 and a third conductive plug 423. The first conductive plug 421 penetrates the fourth dielectric layer 36, the third dielectric layer 34' and the second dielectric layer 32 and is connected to the first doped layer electrode 24. The second conductive plug 422 penetrates the fourth dielectric layer 36 and the third dielectric layer 34' and is connected to the second doped layer electrode 26. The third conductive plug 423 penetrates the fourth dielectric layer 36 and is connected to the third doped layer electrode 16a. In one embodiment, the material of the conductive plug 42 is, for example, tungsten.

Then, as shown in FIG. 1K, an interconnection layer 44 is formed on the first insulating layer 40. The interconnection layer 44 can be a single-layer or multi-layer structure and includes, for example, conductive pillars 441 and the like, which are used for metal circuit or circuit structure in back end of line (BEOL). The interconnection layer 44 is electrically connected to the conductive plug 42 exposed on the first insulating layer 40. In one embodiment, the conductive pillar 441 in the interconnection layer 44 is electrically connected to the conductive plug 42. Then, a semiconductor substrate 46 is bonded to the interconnection layer 44. The semiconductor substrate 46 is, for example, a silicon substrate, an epitaxial silicon substrate, a silicon germanium substrate, a silicon carbide substrate, or a silicon on insulation (SOI) substrate.

Then, as shown in FIG. 1L, the structure shown in FIG. 1K is reversed so that the semiconductor substrate 46 is below and the first portion 121 of the first doped material layer 12 is above. Then, as shown in FIG. 1M, a removal process, such as a chemical polishing process, is performed on the first portion 121 to at least expose the first doped layer 12a of the nano-pillar structure 20. In one embodiment, part of the first insulating layer 40 (e.g., the first dielectric layer 30 (shown in FIG. 1L)) can be removed, so that the first doped layer electrode 24 is also exposed at the same time.

Then, as shown in FIG. 1N, a transparent barrier layer 48 is formed on the first insulating layer 40 to cover the first doped layer 12a (and the first doped layer electrode 24). In one embodiment, the transparent barrier layer 48 is, for example, an oxide layer. Then, an optoelectronic thin film structure 50 is formed on the transparent barrier layer 48. The optoelectronic thin film structure 50 is electrically connected to the interconnection layer 44. In one embodiment, the optoelectronic thin film structure 50 can be electrically connected to the interconnection layer 44 by the conductive pillar 52 or conductive wires passing through the transparent barrier layer 48 and the first insulating layer 40. In one embodiment, the photoelectric thin film structure 50 is a green light image sensor. The photoelectric thin film structure 50 includes a plurality of photoconductive film portions 54 corresponding to the nano-pillar structures 22 respectively. The specific structure and manufacturing process of the optoelectronic thin film structure 50 will be described in the figures below.

FIG. 1N is a schematic structural view of an image sensor structure according to an embodiment of the present invention. As shown in FIG. 1N, the image sensor structure 100 includes a semiconductor substrate 46, an interconnection layer 44, a plurality of nano-pillar structures 22, a first conductive structure 56, a second conductive structure 58, a third conductive structure 60, a first insulating layer 40, a transparent barrier layer 48 and an optoelectronic thin film structure 50. The interconnection layer 44 is disposed on the semiconductor substrate 46. The nano-pillar structures 22 are disposed above the interconnection layer 44. Each nano-pillar structure 22 includes a first doped layer 12a, a second doped layer 14a and a third doped layer 16a stacked in sequence. The third doped layer 16a is adjacent to the interconnection layer 44, and the first doped layer 12a is far away from the interconnection layer 44. The first doped layer 12a and the second doped layer 14a can be used to form a blue light image sensor (Blue PD), and the second doped layer 14a and the third doped layer 16a can be used to form a red light image sensor device (Red PD).

Continue the above description. The first conductive structure 56 is electrically connected to the first doped layer 12a and the interconnection layer 44. Specifically, the first conductive structure 56 includes a first doped layer electrode 24 and a first conductive plug 421. The doped layer electrode 24 surrounds and is connected to the sidewall 123 of the first doped layer 12a. The first conductive plug 421 is electrically connected to the first doped layer electrode 24 and the interconnection layer 44. The second conductive structure 58 is electrically connected to the second doped layer 14a and the interconnection layer 44. Specifically, the second conductive structure 58 includes a second doped layer electrode 26 and a second conductive plug 422. The second doped layer electrode 26 surrounds and is connected to the sidewall 141 of the second doped layer 14a. The second conductive plug 422 is electrically connected to the second doped layer electrode 26 and the interconnection layer 44. The third conductive structure 60 (i.e., the third conductive plug 423) is electrically connected to the third doped layer 16a and the interconnection layer 44.

In addition, the first insulating layer 40 is formed on the interconnection layer 44 and wraps the nano-pillar structures 22, the first conductive structure 56, the second conductive structure 58 and the third conductive structure 60. The first doped layer 12a of the nano-pillar structure 22 is exposed on the first insulating layer 40. The transparent barrier layer 48 is formed on the first insulating layer 40 to cover the exposed first doped layer 12a. The optoelectronic thin film structure 50 is disposed on the transparent barrier layer 48. The optoelectronic thin film structure 50 is a green light image sensor. The optoelectronic thin film structure 50 includes a plurality of photoconductive film portions 54 corresponding to the nano-pillar structures 22 respectively.

In the image sensor structure 100 according to the embodiment of the present invention, the first insulating layer 40 wraps the nano-pillar structures 22. The nano-pillar structures 22 include stacked red light image sensors and blue light image sensors. The photoelectric thin film structure 50 is disposed at intervals on the first insulating layer 40. The photoelectric thin film structure 50 includes a photoconductive film portion 54 for sensing green light. Thus, through the design in which the photoconductive film portion 54 for sensing green light and the blue/red light image sensors stacked in the nano-pillar structure 22 are separated, the spectral characteristics of the image sensor structure 100 are improved, the red (R)/green (G)/blue (B) photosensitive regions are balanced, the adjacent pixels (i.e., the adjacent nano-pillar structures 22) have improved isolation effect, and the problem of optical crosstalk is also effectively avoided. In addition, compared with the traditional image sensor structure using pixel mosaic patterns, the image sensor structure 100 of the embodiment of the present invention can reduce the photosensitive area of the pixel by 75%, which meets the requirement of miniaturization. Furthermore, the image sensor structure 100 of the embodiment of the present invention is a backside illumination (BSI) structure, that is, the interconnection layer 44 (or the wiring layer) is located under the nano-pillar structure 22 rather than on the light source side above the nano-pillar structure 22. Thus, the incident light is not affected by the conductive pillars 441 or the conductive wires of the interconnection layer 44 and therefore is not deflected, thereby effectively improving the filling factor and quantum efficiency.

Figure 2A:
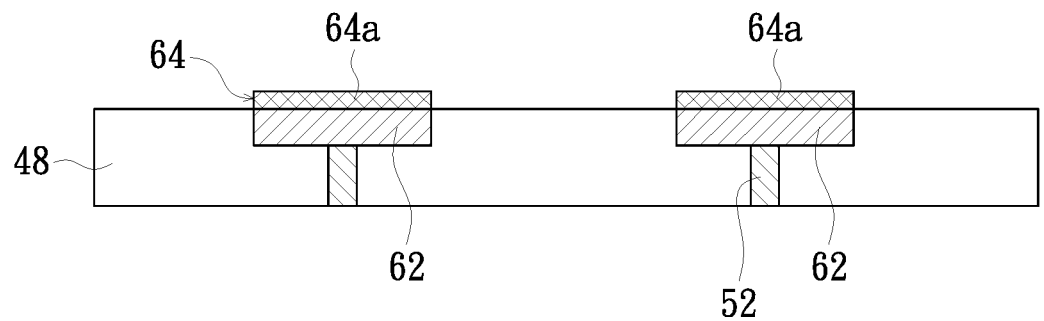
FIGS. 2A to 2G are schematic cross-sectional views illustrating a process of forming an optoelectronic thin film structure according to an embodiment of the present invention.

FIGS. 2A to 2G are schematic cross-sectional views illustrating a process of forming an optoelectronic thin film structure according to an embodiment of the present invention. In the figures, only a part of the image sensor structure is shown, specifically, only the schematic views of the process of forming the transparent barrier layer 48 and the optoelectronic thin film structure 50 on the transparent barrier layer 48 are shown, and the first insulating layer 40 (shown in FIG. 1N) and the nano-pillar structure 22 (shown in FIG. 1N) under the transparent barrier layer 48 are not shown. As shown in FIG. 2A, a plurality of conductive pillars 52 and a plurality of first transparent electrodes 62 are formed. The conductive pillars 52 penetrate through the transparent barrier layer 48 and the first insulating layer 40 (shown in FIG. 1N). One end of the conductive pillar 52 is electrically connected to the interconnection layer 44 (shown in FIG. 1N), and the other end of the conductive pillar 52 is electrically connected to the first transparent electrode 62. The first transparent electrodes 62 are distributed and exposed on the transparent barrier layer 48, and the distribution of the first transparent electrodes 62 corresponds to the distribution of the nano-pillar structures 22 (shown in FIG. 1N). Then, a hole transport layer (HTL) 64 is formed on the transparent barrier layer 48, and the hole transport layer 64 is patterned. The patterned hole transport layer 64 includes a plurality of hole transport portions 64a correspondingly disposed on the first transparent electrodes 62. In one embodiment, the method of forming the hole transport layer 64 includes depositing $WO_3$, $MoO_x$, $NiO_x$ or a combination thereof on the transparent barrier layer 48.

Figure 2B:
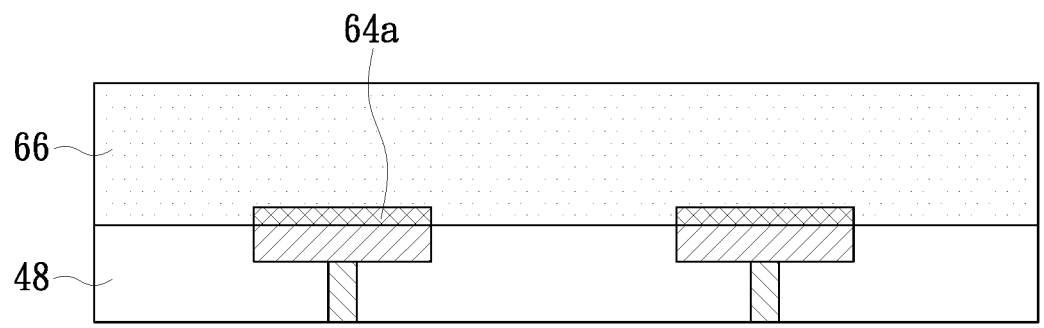
Figure 2C:
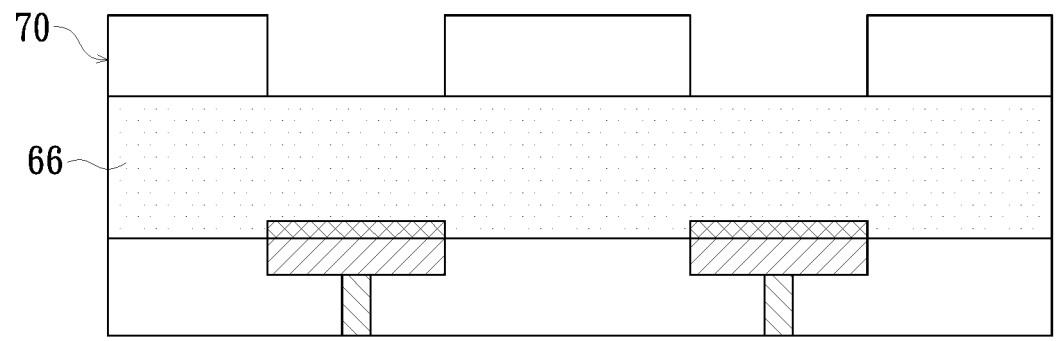
Figure 2D:
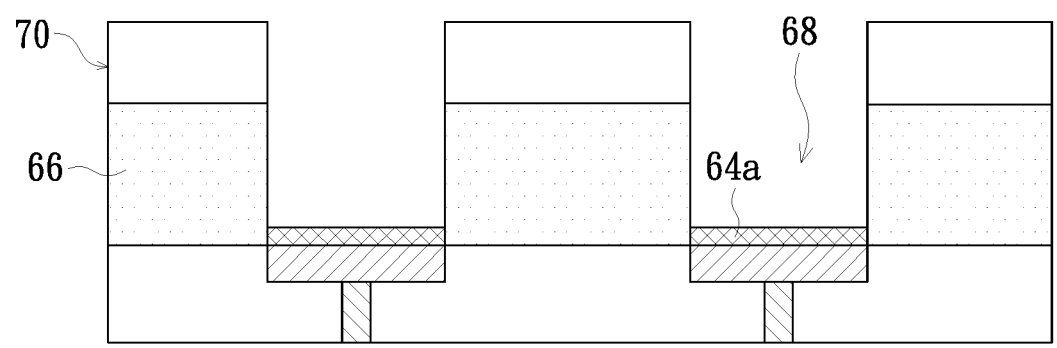

Then, as shown in FIG. 2B, a second insulating layer 66 is formed on the transparent barrier layer 48 to cover the hole transport portions 64a. Then, as shown in FIGS. 2C and 2D, the second insulating layer 66 is patterned to form a plurality of second trenches 68 in the second insulating layer 66. The hole transport portions 64a are respectively exposed through the second trenches 68. In one embodiment as shown in FIG. 2C, the method of patterning the second insulating layer 66 is firstly forming a patterned photoresist layer 70 on the second insulating layer 66, and then moving a part of the second insulating layer 66 by using the patterned photoresist layer 70 as a mask, as shown in FIG. 2D, so as to form the second trenches 68 in the second insulating layer 66.

Figure 2E:
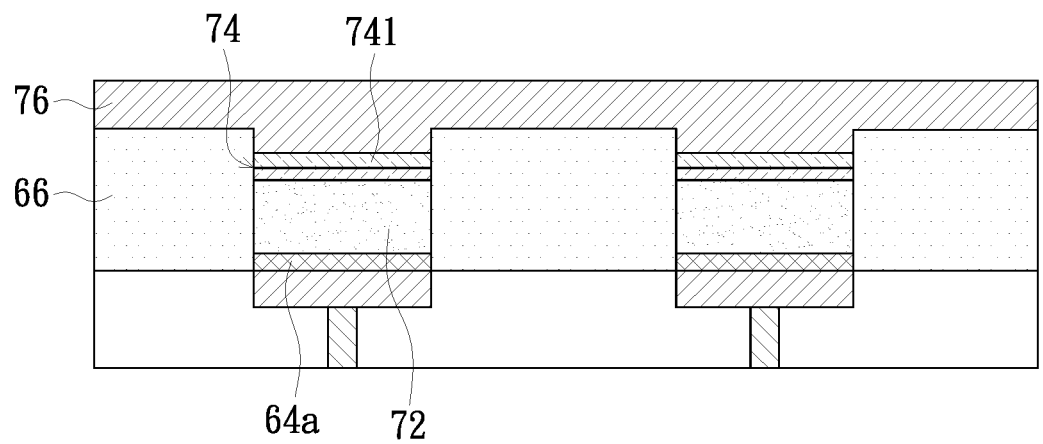
Figure 2F:
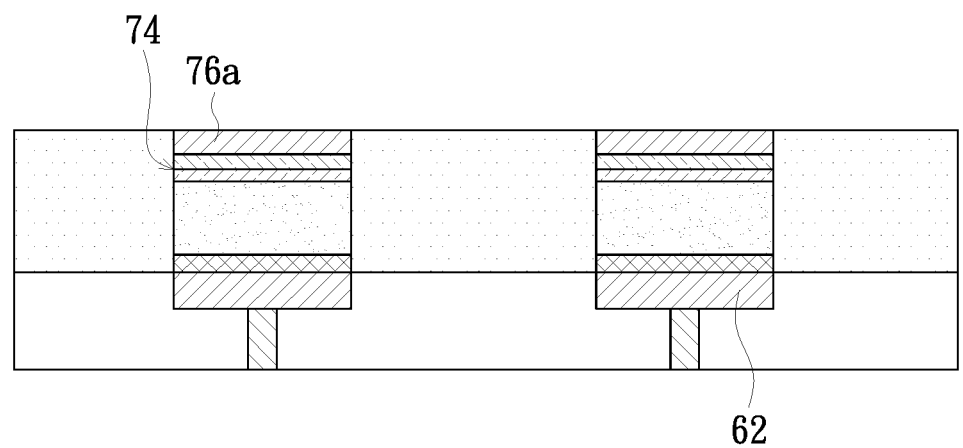

Then, as shown in FIG. 2E, a plurality of absorbing material portions 72 are formed. The absorbing material portions 72 are formed in the second trenches 68 (labeled in FIG. 2D) and disposed on hole transport portions 64a, respectively. In one embodiment, the absorbing material portion 72 includes perovskite, and the material of the perovskite includes $MAPbBr_3$, $CsPbBr_3$, $FAPbBr_3$, $MASnBr_3$, or a combination thereof. Then, as shown in FIG. 2E, a plurality of electron transport portions 74 are formed. The electron transport portions 74 are formed in the second trenches 68 (labeled in FIG. 2D) and disposed on the absorbing material portions 72, respectively. In one embodiment, the method for forming the electron transport portion 74 includes firstly depositing $TiO_2$, ZnO, $SnO_2$, $MoO_x$ or a combination thereof, and then forming an aluminum layer 741. Then, as shown in FIG. 2E, a transparent electrode layer 76 is formed on the second insulating layer 66. The transparent electrode layer 76 fills the second trenches 68 (labeled in FIG. 2D). Then, a polishing process is performed to remove a part of the transparent electrode layer 76, and only the part of the transparent electrode layer 76 located in the second trenches 68 remains. As shown in FIG. 2F, the parts of the transparent electrode layer 76 that fill the second trenches 68 are used as the second transparent electrodes 76a and are respectively disposed on (the aluminum layer 741 of) the electron transport portions 74. In one embodiment, the materials of the first transparent electrode 62 and the second transparent electrode 76a include ITO, AZO, indium-doped cadmium oxide, FTO, or IZO.

Figure 2G:
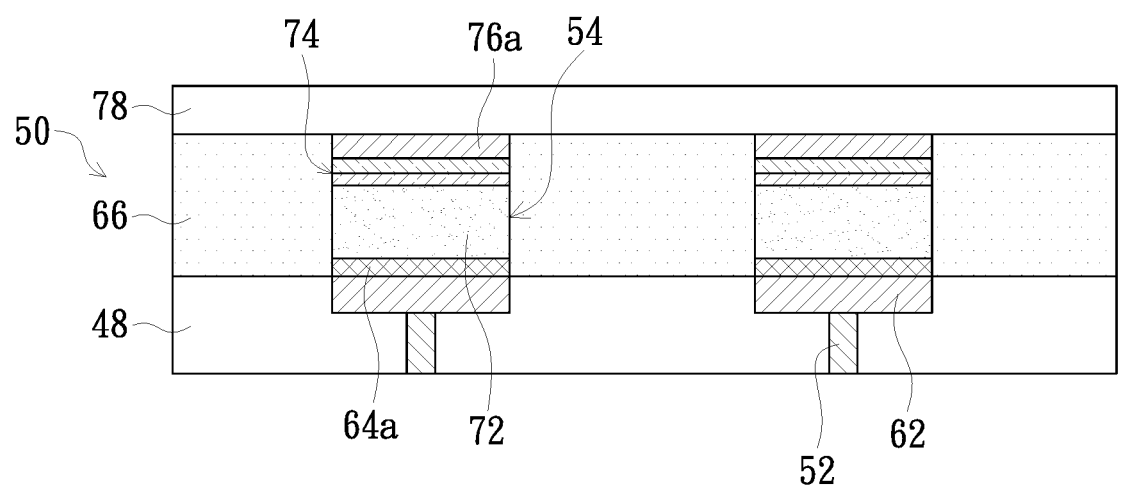

Then, as shown in FIG. 2G, a transparent package 78 is formed to cover the second insulating layer 66 and the second transparent electrodes 76a, so as to form an optoelectronic thin film structure 50. Specifically, as shown in FIG. 2G, the photoelectric thin film structure 50 includes a plurality of photoconductive film portions 54, a second insulating layer 66 covering part of the photoconductive film portions 54 and a transparent package 78. Each photoconductive film portion 54 includes a conductive pillar 52 and a first transparent electrode 62, a hole transport portion 64a, an absorbing material portion 72, an electron transport portion 74 and a second transparent electrode 76a stacked in sequence. The conductive pillar 52 penetrates the transparent barrier layer 48 and the first insulating layer 40 (shown in FIG. 1N). One end of the conductive pillar 52 is electrically connected to the interconnection layer 44 (shown in FIG. 1N), and the other end of the conductive pillar 52 is electrically connected to the first transparent electrode 62. The second insulating layer 66 is disposed on the transparent barrier layer 48 and filled between the photoconductive film portions 54. The transparent package 78 covers the second insulating layer 66 and the photoconductive film portion 54.

Figure 3A:
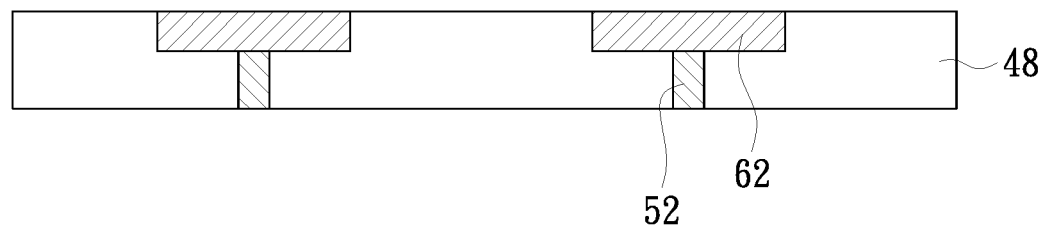
FIGS. 3A to 3E are schematic cross-sectional views illustrating a process of forming an optoelectronic thin film structure according to another embodiment of the present invention.

In the above embodiment, it is exemplified that the absorbing material portion 72 includes perovskite, but the invention is not limited thereto. The process of forming the optoelectronic thin film structure 50 is also different depending on the used absorbing material portion 72. FIGS. 3A to 3E are schematic cross-sectional views illustrating a process of forming an optoelectronic thin film structure according to another embodiment of the present invention. In the figures, only a part of the image sensor structure is shown, specifically, only the schematic views of the process of forming the transparent barrier layer 48 and the optoelectronic thin film structure 50 on the transparent barrier layer 48 are shown, and the first insulating layer 40 (shown in FIG. 1N) and the nano-pillar structure 22 (shown in FIG. 1N) under the transparent barrier layer 48 are not shown. As shown in FIG. 3A, a plurality of conductive pillars 52 and a plurality of first transparent electrodes 62 are formed. The conductive pillars 52 penetrate through the transparent barrier layer 48 and the first insulating layer 40 (shown in FIG. 1N). One end of the conductive pillar 52 is electrically connected to the interconnection layer 44 (shown in FIG. 1N), and the other end of the conductive pillar 52 is electrically connected to the first transparent electrode 62. A plurality of first transparent electrodes 62 are distributed and exposed on the transparent barrier layer 48, and the distribution of the first transparent electrodes 62 corresponds to the distribution of the nano-pillar structures 22 (shown in FIG. 1N).

Figure 3B:
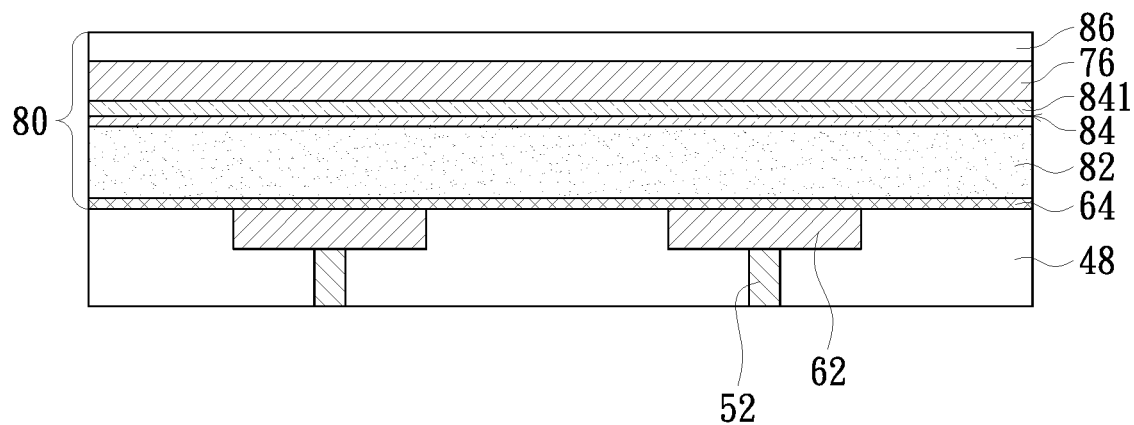

Then, as shown in FIG. 3B, a photoconductive film stack structure 80 is formed on the transparent barrier layer 48. The formation of the photoconductive film stack structure 80 includes sequentially forming a hole transport layer 64, an organic photoconductive film 82, an electron transport layer 84, a transparent electrode layer 76 and the protective layer 86. In one embodiment, the method of forming the hole transport layer 64 includes coating PEDOT:PSS, $NiO_x$, $MoO_x$, Spiro-MeOTAD, or a combination thereof. In one embodiment, the organic photoconductive film 82 includes an electron donor (not shown in the figure) and an electron acceptor (not shown in the figure). The material of the electron donor includes boron subphthalocyanine chloride or N,N'-dimethylquinacridone. The material of the electron acceptor includes pentafluorophenoxy substituted boron subphthalocyanine chloride or di-n-butyl substituted dicyanovinyltrithiophene. Preferably, the light absorption peak of the organic photoconductive film 82 is between 500 nm and 600 nm. In one embodiment, the method of forming the electron transport layer 84 includes firstly depositing $TiO_2$, ZnO, $SnO_2$, $MoO_x$ or a combination thereof, and then forming an aluminum layer 841. In addition, the materials of the first transparent electrode 62 and the transparent electrode layer 76 include ITO, AZO, indium-doped cadmium oxide, FTO or IZO.

Figure 3C:
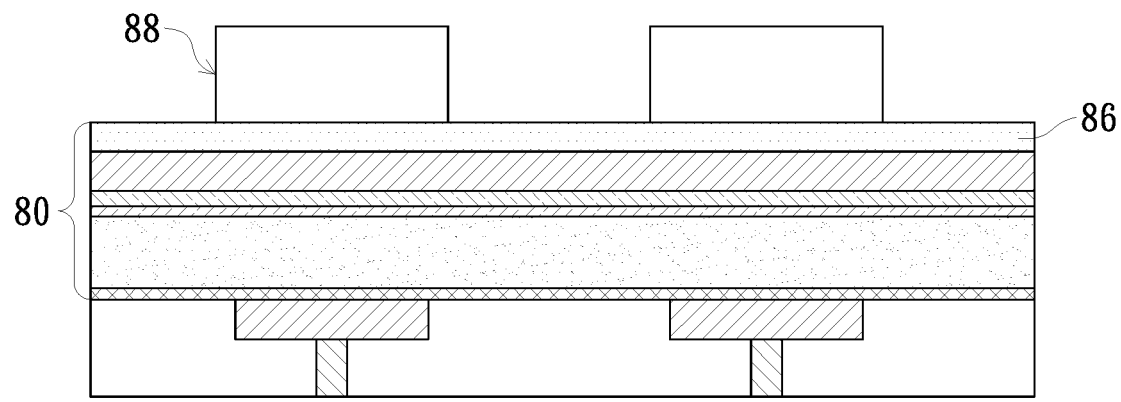
Figure 3D:
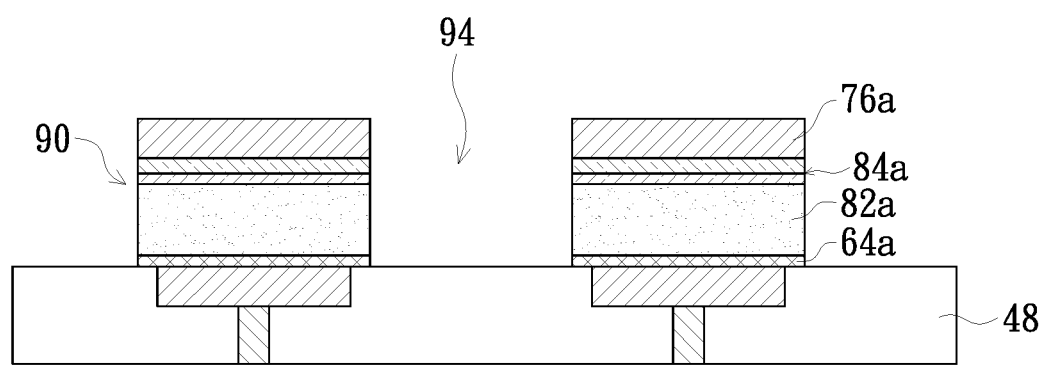
Figure 3E:
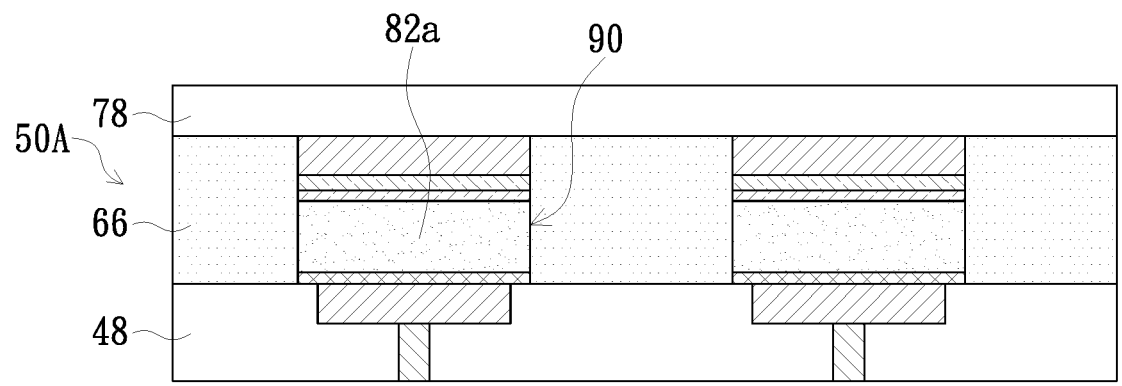

Continue the above description. The photoconductive film stack structure 80 is patterned and the protective layer 86 is removed to form a plurality of sub-stack structures 90 (marked in FIG. 3D). In one embodiment as shown in FIGS. 3C and 3D, the method of patterning the photoconductive film stack structure 80 includes forming a patterned photoresist layer 88 on the protective layer 86, using the patterned photoresist layer 88 as a mask to remove a part of the photoconductive film stack structure 80 so as to form a plurality of third trenches 94 in the photoconductive film stack structure 80, and removing the protective layer 86 of the photoconductive film stack structure 80 that has not been removed to form a plurality of sub-stack structures 90 on the transparent barrier layer 48. Each sub-stack structure 90 includes a hole transport portion 64a, an organic photoconductive film portion 82a, an electron transport portion 84a and a second transparent electrode 76a in sequence from bottom to top. Then, as shown in FIG. 3E, a second insulating layer 66 is formed on the transparent barrier layer 48 and is filled between the sub-stack structures 90, and a transparent package 78 is further formed to cover the second insulating layer 66 and the sub-stack structures 90. Thus an optoelectronic thin film structure 50A is formed. Specifically, the structure of the optoelectronic thin film structure 50A shown in FIG. 3E is substantially the same as that of the optoelectronic thin film structure 50 shown in FIG. 2G. The main difference between the two is that the absorbing material portion 72 of the optoelectronic thin film structure 50 includes perovskite. In the photoelectric thin film structure 50A, the organic photoconductive film portion 82a is used to replace the absorbing material portion 72 including perovskite.

According to the above, the photoelectric thin film structure with the organic photoconductive film portion or perovskite as the absorbing material portion is mainly used as a green light image sensor. By using the transparent barrier layer to separate the photoconductive film portion for sensing green light and the blue/red light image sensor stacked by the nano-pillar structures, the spectral characteristics of the image sensor structure are improved, the RGB color sensitive areas are balanced, the isolation effect of the adjacent pixels is improved, and the optical crosstalk problem is effectively avoided.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An image sensor structure, comprising:
a semiconductor substrate;
at least one interconnection layer, disposed on the semiconductor substrate;
a plurality of nano-pillar structures, wherein each of the nano-pillar structures comprises a first doped layer, a second doped layer and a third doped layer stacked in sequence, the third doped layer is adjacent to the at least one interconnection layer, and the first doped layer is away from the at least one interconnection layer;
a plurality of first conductive structures, wherein each of the first conductive structures is electrically connected to the first doped layer and the at least one interconnection layer;
a plurality of second conductive structures, wherein each of the second conductive structures is electrically connected to the second doped layer and the at least one interconnection layer;
a plurality of third conductive structures, wherein each of the third conductive structures is electrically connected to the third doped layer and the at least one interconnection layer;
a first insulating layer, formed on the at least one interconnection layer to wrap the nano-pillar structures, the first conductive structures, the second conductive structures and the third conductive structures, wherein the first doped layer of each of the nano-pillar structures is exposed on the first insulating layer;
a transparent barrier layer, formed on the first insulating layer to cover the exposed first doped layer; and
an optoelectronic thin film structure, disposed on the transparent barrier layer and electrically connected to the at least one interconnection layer, wherein the optoelectronic thin film structure comprises a plurality of photoconductive film portions corresponding to the nano-pillar structures respectively.

2. The image sensor structure according to claim 1, wherein each of the first conductive structures comprises a first doped layer electrode and a first conductive plug, the first doped layer electrode surrounds and is connected to a sidewall of the first doped layer, and the first conductive plug penetrates through the first insulating layer and is electrically connected to the first doped layer electrode and the at least one interconnection layer.

3. The image sensor structure according to claim 1, wherein each of the second conductive structures comprises a second doped layer electrode and a second conductive plug, the second doped layer electrode surrounds and is connected to a sidewall of the second doped layer, and the second conductive plug penetrates through the first insulating layer and is electrically connected to the second doped layer electrode and the at least one interconnection layer.

4. The image sensor structure according to claim 1, wherein each of the third conductive structures comprises a third conductive plug penetrating through the first insulating layer and electrically connected to the third doped layer and the at least one interconnection layer.

5. The image sensor structure according to claim 1, wherein the first doped layer and the second doped layer form a blue light image sensor, the second doped layer and the third doped layer form a red light image sensor, and the photoelectric thin film structure is a green light image sensor.

6. The image sensor structure according to claim 1, wherein the first doped layer and the third doped layer have a same first doping type, the second doped layer has a second doping type, and the second doping type is different from the first doping type.

7. The image sensor structure according to claim 1, wherein each of the photoconductive film portions comprises a conductive pillar and a first transparent electrode, a hole transport portion, an absorbing material portion, an electron transfer portion, and a second transparent electrode stacked in sequence, the conductive pillar penetrates through the transparent barrier layer and the first insulating layer, a first end of the conductive pillar is electrically connected to the at least one interconnection layer, and a second end of the conductive pillar is electrically connected to the first transparent electrode.

8. The image sensor structure according to claim 7, wherein the photoelectric thin film structure is a green light image sensor, and the absorbing material portion comprises perovskite or organic photoelectric material.

9. The image sensor structure according to claim 1, wherein the photoelectric thin film structure further comprises a second insulating layer and a transparent package, the second insulating layer is disposed on the transparent barrier layer and filled between the photoconductive film portions, and the transparent package wraps the second insulating layer and the photoconductive film portions.

10. The image sensor structure according to claim 1, wherein the transparent barrier layer is an oxide layer.

11. A manufacturing method of an image sensor structure, comprising:
forming a semiconductor stack structure, wherein the semiconductor stack structure comprises a first doped material layer, a second doped material layer and a third doped material layer stacked in sequence, the first doped material layer comprises a first portion and a second portion, the second portion is located on the first portion and is between the second doped material layer and the first portion;

forming a mask layer on the semiconductor stack structure, patterning the mask layer and the semiconductor stack structure, forming a plurality of first trenches penetrating through the mask layer, the third doped material layer, the second doped material layer and the second portion, so as to form a plurality of nano-pillar structures and a plurality of mask portions on the first portion, and exposing the first portion through the first trenches, wherein each of the nano-pillar structures comprises a first doped layer, a second doped layer and a third doped layer stacked on the first portion in sequence, and each of the mask portions is located on the third doped layer;

forming a plurality of first doped layer electrodes and a plurality of second doped layer electrodes in the first trenches, wherein each of the first doped layer electrodes is connected to a sidewall of the first doped layer, and each of the second doped layer electrodes is connected to a sidewall of the second doped layer;

forming a first insulating layer to cover the nano-pillar structures and the first trenches;

forming a plurality of conductive plugs to penetrate the first insulating layer, wherein first ends of the conductive plugs are respectively electrically connected to the first doped layer electrodes, the second doped layer electrodes and the third doped layer of each of the nano-pillar structures, and second ends of the conductive plugs are exposed on the first insulating layer;

forming at least one interconnection layer on the first insulating layer, wherein the conductive plugs are electrically connected to the at least one interconnection layer;

bonding a semiconductor substrate on the at least one interconnection layer;

removing the first portion to expose at least the first doped layer of each of the nano-pillar structures;

forming a transparent barrier layer to cover the exposed first doped layer; and forming an optoelectronic thin film structure on the transparent barrier layer, wherein the optoelectronic thin film structure is electrically connected to the at least one interconnection layer, and the optoelectronic thin film structure comprises a plurality of photoconductive film portions corresponding to the nano-pillar structures respectively.

12. The manufacturing method of the image sensor structure according to claim 11, wherein the first doped layer and the second doped layer form a blue light image sensor, the second doped layer and the third doped layer form a red light image sensor, and the photoelectric thin film structure is a green light image sensor.

13. The manufacturing method of the image sensor structure according to claim 11, wherein the first doped layer and the third doped layer have a same first doping type, the second doped layer has a second doping type, and the second doping type is different from the first doping type.

14. The manufacturing method of the image sensor structure according to claim 11, wherein a method for forming the semiconductor stack structure is selected from one of an epitaxial growth process and an ion implantation process or a combination thereof.

15. The manufacturing method of the image sensor structure according to claim 11, wherein a method for forming the first doped layer electrodes and the second doped layer electrodes comprises:

forming a first dielectric layer on the first portion exposed through the first trenches;

forming the first doped layer electrodes on the first dielectric layer, wherein each of the first doped layer electrodes respectively surrounds and is connected to the sidewall of the first doped layer;

forming a second dielectric layer on the first dielectric layer to cover the first doped layer electrodes; and forming the second doped layer electrodes on the second dielectric layer, wherein each of the second doped layer electrodes respectively surrounds and is connected to the sidewall of the second doped layer, and the first dielectric layer and the second dielectric layer are used as a part of the first insulating layer.

16. The manufacturing method of the image sensor structure according to claim 15, wherein a method for forming the first insulating layer comprises:

forming a third dielectric layer on the second dielectric layer to cover the second doped layer electrodes, the nano-pillar structures and the mask portions;

removing a part of the third dielectric layer and the mask portions to expose the third doped layer; and forming a fourth dielectric layer on the third dielectric layer to cover the third doped layer.

17. The manufacturing method of the image sensor structure according to claim 11, wherein each of the photoconductive film portions comprises a conductive pillar and a first transparent electrode, a hole transport portion, an absorbing material portion, an electron transfer portion, and a second transparent electrode stacked in sequence, the conductive pillar penetrates through the transparent barrier layer and the first insulating layer, a first end of the conductive pillar is electrically connected to the at least one interconnection layer, and a second end of the conductive pillar is electrically connected to the first transparent electrode.

18. The manufacturing method of the image sensor structure according to claim 11, wherein a method for forming the photoelectric thin film structure comprises:

forming a plurality of conductive pillars and a plurality of first transparent electrodes, wherein the conductive pillars penetrate through the transparent barrier layer and the first insulating layer, first ends of the conductive pillars are electrically connected to the at least one interconnection layer, second ends of the conductive pillars are respectively electrically connected to the first transparent electrodes, the first transparent electrodes are distributed and exposed on the transparent barrier layer, and a distribution of the first transparent electrodes corresponds to the nano-pillar structures;

forming a hole transport layer on the transparent barrier layer and patterning the hole transport layer, wherein the patterned hole transport layer comprises a plurality of hole transport portions respectively disposed on the first transparent electrodes;

forming a second insulating layer on the transparent barrier layer to cover the hole transport portions;

patterning the second insulating layer to form a plurality of second trenches in the second insulating layer, wherein the hole transport portions are exposed through the second trenches respectively;

forming a plurality of absorbing material portions, wherein the absorbing material portions are formed in the second trenches and disposed on the hole transport portions respectively;

forming a plurality of electron transport portions, wherein the electron transport portions are formed in the second trenches and disposed on the absorbing material portions respectively;

forming a plurality of second transparent electrodes, wherein the second transparent electrodes are formed in the second trenches and disposed on the electron transport portions respectively; and forming a transparent package to wrap the second insulating layer and the second transparent electrodes.

19. The manufacturing method of the image sensor structure according to claim 18, wherein a method for forming the hole transport layer comprises: depositing $WO_3$, $MoO_x$, $NiO_x$ or a combination thereof.

20. The manufacturing method of the image sensor structure according to claim 18, wherein the absorbing material portions comprise perovskite, and a material of the perovskite comprises $MAPbBr_3$, $CsPbBr_3$, $FAPbBr_3$, $MASnBr_3$, or a combination thereof.

21. The manufacturing method of the image sensor structure according to claim 18, wherein a method for forming the electron transport portion comprises: depositing $TiO_2$, $ZnO$, $SnO_2$, $MoO_x$, or a combination thereof, and then forming an aluminum layer.

22. The manufacturing method of the image sensor structure according to claim 18, wherein materials of the first transparent electrodes and the second transparent electrodes comprise ITO, AZO, indium-doped cadmium oxide, FTO or IZO.

23. The manufacturing method of the image sensor structure according to claim 11, wherein a method for forming the photoelectric thin film structure comprises:

forming a plurality of conductive pillars and a plurality of first transparent electrodes, wherein the conductive pillars penetrate through the transparent barrier layer and the first insulating layer, first ends of the conductive pillars are electrically connected to the at least one interconnection layer, second ends of the conductive pillars are respectively electrically connected to the first transparent electrodes, the first transparent electrodes are distributed and exposed on the transparent barrier layer, and a distribution of the first transparent electrodes corresponds to the nano-pillar structures;

forming a photoconductive film stack structure on the transparent barrier layer, a method for forming the photoconductive film stack structure comprises sequentially forming a hole transport layer, an organic photoconductive film, an electron transport layer, a transparent electrode layer and a protective layer;

patterning the photoconductive film stack structure and removing the protective layer to form a plurality of sub-stack structures, wherein the sub-stack structures are respectively located on the first transparent electrodes, and each of the sub-stack structures comprises a hole transport portion, an organic photoconductive film portion, an electron transport portion and a second transparent electrode in sequence;

forming a second insulating layer on the transparent barrier layer and filling the second insulating layer between the sub-stack structures; and forming a transparent package to wrap the second insulating layer and the sub-stack structures.

24. The manufacturing method of the image sensor structure according to claim 23, wherein a method for forming the hole transport layer comprises: coating PEDOT:PSS, $NiO_x$, $MoO_x$, Spiro-MeOTAD, or a combination thereof.

25. The manufacturing method of the image sensor structure according to claim 23, wherein the organic photoconductive film comprises an electron donor and an electron acceptor, a material of the electron donor comprises boron subphthalocyanine chloride or N,N'-dimethylquinacridone, a material of the electron acceptor comprises pentafluorophenoxy substituted boron subphthalocyanine chloride or di-n-butyl substituted dicyanovinyltrithiophene.

26. The manufacturing method of the image sensor structure according to claim 23, wherein a light absorption peak of the organic photoconductive film is between 500 nm and 600 nm.

27. The manufacturing method of the image sensor structure according to claim 23, wherein a method for forming the electron transport portion comprises: depositing $TiO_2$, $ZnO$, $SnO_2$, $MoO_x$, or a combination thereof, and then forming an aluminum layer.

28. The manufacturing method of the image sensor structure according to claim 23, wherein materials of the first transparent electrodes and the second transparent electrodes comprise ITO, AZO, indium-doped cadmium oxide, FTO or IZO.

* * * * *